United States Patent [19]

Maier

[11] 3,820,027

[45] June 25, 1974

[54] CIRCUIT ARRANGEMENT FOR AUTOMATIC STATION SEARCH

[75] Inventor: Gerhard Maier, Schwenningen, Germany

[73] Assignee: SABA, Schwarzwalder Apparate-Bau-Anstalt Augurt Schwer Sohne G.m.b.H., Villengen, Germany

[22] Filed: Nov. 3, 1972

[21] Appl. No.: 303,607

[30] Foreign Application Priority Data

Dec. 3, 1971 Germany ............................ 2160004

[52] U.S. Cl. .......... 325/470, 178/DIG. 15, 325/464, 328/152

[51] Int. Cl. ............................................ H04b 1/32

[58] Field of Search ........... 325/452, 464, 469, 470, 325/468; 325/152, 154; 178/DIG. 15

[56] References Cited

UNITED STATES PATENTS 3,467,870 9/1969 Aoyama .............................. 325/470

*Primary Examiner*—Robert L. Griffin

*Assistant Examiner*—Marc E. Bookbinder

*Attorney, Agent, or Firm*—GTE International Incorporated

[57] ABSTRACT

A circuit arrangement for controlling tuning operations in a high frequency receiver employs a high impedance such as a field-effect transistor coupled between a capacitor and tuning varactors. The capacitor is connected via a relay contact, to either chassis ground or to a charging voltage source depending on the desired search direction. The relay is controlled by a first bistable multivibrator as a function of the state of a second bistable multivibrator. When a station signal is detected there is directed to the first multivibrator a pulse which is derived directly from said station signal. The relay is switched off, via a switching stage controlled by the first multivibrator, to thereby disconnect the charging capacitor from the source and stopping the tuning operation.

5 Claims, 2 Drawing Figures

CIRCUIT ARRANGEMENT FOR AUTOMATIC STATION SEARCH

BACKGROUND OF THE INVENTION

In broadcast receivers it is known to provide an automatic search mechanism by which the tuning system is adjusted automatically to a station having a predetermined signal level at the receiver. In these equipments a push button starts a motor which in turn adjusts a tuning means, such as a variable capacitor, until a station signal automatically stops the tuning system.

Also known are circuit arrangements in which the receiver is automatically tuned to a station by electronic means employing varactors as the tuning elements. Here the tuning diodes are supplied a steadily increasing tuning voltage which is held constant by the automatic system when a station is received. A sawtooth generator, used to generate the steadily increasing tuning voltage includes a capacitor and an electronically controlled discharge path. The capacitor is supplied a constant charging current so that a steadily rising voltage is obtained across it. At the end of the tuning range the capacitor is discharged by means of an electronically controlled discharge path before the charging process begins anew. Although the tuning is purely electronic this circuit arrangement has the disadvantage that the tuning can be carried out only in one direction, from low to high frequencies. In the known circuit arrangement the transmitted signal is captured by a ratio detector. For this purpose the emitter-collector path of a transistor is connected in shunt to the charging capacitor, the voltage of which is kept constant when a given station is reached. The control voltage for this transistor is taken from a discriminator. The control voltage, however, must exceed a definite value of the base-emitter voltage as a response threshold for the circuit to be enabled and the search run to be stopped. Because of the threshold set by the transistor, however, one cannot tune exactly to the desired frequency.

In the aforementioned circuit the automatic fine tuning is effective only in one direction as the transistor is cut off only if the voltage falls below the threshold voltage. This results in a large hysteresis with poor tuning and unilaterally-acting fine frequency tuning. This circuit arrangement has a furthermore disadvantage that, with the response threshold kept constant and the signal level varying, a tuning error develops. As the ratio detector changes as a function of the signal level and the distance between the peaks shifts causing the frequency deviation relative to the center frequency $f_o$ changes as a function of the signal field strength.

In addition, a transistor switch is activated via the charging current to stop the station search cycle. In consideration of a very definite magnitude of the input impedance of this transistor switch the charging current must just correspond to the response threshold of the transistor in order to stop the circuit. This means, however, that the circuit must operate with a very definite integration speed in order to supply the charging current required for the switching. This assumes that a very high driving voltage is necessary which must be very much higher than the final voltage of the circuit, as otherwise the capacitor would cause only a small change of the charging current, and the circuit could no longer be stopped. The circuit arrangement has the obvious disadvantage that the end voltage for the varactors cannot be set because the tuning voltage always starts with zero.

There is further known a circuit arrangement for an automatic search cycle in which the unintended initiation of a search run due to field strength fluctuations is suppressed. An auxiliary oscillator is employed as a substitute in the event of transmitter fading. This means, however, that the tuning of the auxiliary oscillator and that of the receiver oscillator must track exactly, which is not readily achievable without great cost in circuitry. Such tracking must exist in the entire tuning range so that closely spaced stations can be received and distinguised. Moreover every oscillator has a drift of its own which adds to the inaccuracy. Also in this circuit arrangement, a capacitor is charged for the search operation by means of a sawtooth voltage, so that this circuit is also effective in only one tuning direction. Again the circuit of the search run is automatically stopped by the ratio detector voltage with the detrimental effect of the field-strength dependence and the hysteresis of the control transistor on the tuning accuracy. Like the previously described circuit arrangement, the automatic fine frequency tuning acts here also in only one direction. In order to keep the charging voltage constant provision must be made through auxiliary circuits to continuously replenish the charge as the impedance of this circuit arrangement is not high enough to preclude the voltage across the capacitor from dropping continuously (German Published Patent Application No. 1,277,378).

In a further circuit arrangement it is proposed to discharge a capacitor to supply the tuning voltage and to stop this process when a station having a certain signal level is reached. The tuning voltage is held constant by replenishing the undesired loss of charge by means of a bistable flipflop circuit when a given threshold is reached. Hysteresis occurs as it is impossible to stop exactly at the resonance frequency. This circuit is also found to have its frequency deviation dependent upon the received signal level. In contrast to the other circuits discussed hereinabove the last-mentioned circuit operates with a falling tuning voltage. However, the automatic fine frequency adjustment can be adjusted only from one direction. Should at some time the capacitor be charged, due to external influences, to a voltage which corresponds to the other side of the desired turning, it is necessary to wait until the capacitor has discharged to the point that the automatic fine frequency tuning pulls toward $f_o$ from the other side. (German Published Patent Application No. 1,184,816).

Similar conditions are present in a circuit arrangement, in which a bistable multivibrator charges a capacitor via a diode and a resistor for generating the tuning voltage. When a station is reached the bistable multivibrator is reset and the capacitor retains its charge for an instant. However, the voltage of the capacitor will drop continuously due to the low-impedance design of the circuit. Upon reaching a response threshold the capacitor is recharged via the bistable multivibrator and a constant hunting result. As in the circuits described before, the disadvantages also exist here that it is impossible to stop at the desired tuning exactly, that the search cycle functions only in one direction and that the start or end point of the tuning voltages cannot be set. In the event of field strength fluctuations the capacitor is discharged and the automatic fine frequency control is no longer in a position to capture the station (German Published Patent Application No. 1,288,647).

In order to store the tuning voltage for longer period it has been proposed to use a field-effect transistor with high impedance input for a charging capacitor. The capacitor is charged via a glow lamp and is suddenly discharged when the final charge is reached. The disadvantage of a preferred direction of tuning manifests itself here also. Beyond this, the use of glow lamps has the disadvantage that they require high operating voltages and can therefore not be installed in battery-operated sets.

It is an object of the present invention to eliminate the disadvantages of the known circuit arrangements. The circuit arrangement according to the invention makes possible a search run in both directions permitting accurate stopping when a station is reached and assures that the tuning voltage and therefore the station is kept constant over an extended period of time. Furthermore, the automatically searched station is tuned in exactly and is independent of the length of time the search button is depressed.

BRIEF SUMMARY OF THE INVENTION

According to the invention, in a multichannel receiver, a circuit arrangement for generating a tuning voltage comprises:

an output terminal;

voltage storage means operative to store voltage levels;

a high impedance circuit element coupled between said output terminal and said voltage storage means and including a control terminal and being operative in response to a signal at its control terminal to couple energy to said output terminal;

first switching means having an output connection coupled to the common juncture of said voltage storage means and said high impedance circuit element; an input connection and a control connection and being operative in response to first and second signal conditions at its control connection to respectively connect and disconnect its input and output connections;

driving means having an output connection coupled to the input connection of said first switching means and an input connection and being operative in response to a first or second signal condition at its input connection to respectively increase or decrease, via said first switching means, the voltage of said voltage storage means; and threshold means having an output connection coupled to the control connection of said first switching means and an output terminal and being operative when a signal at said multichannel receiver exceeds a predetermined threshold to generate the second signal condition at said first switching means and to generate the first signal condition at said first switching means when received signals are below a predetermined threshold.

According to the invention, the disadvantages of the known electronic automatic search systems are avoided through the provision that, for the purpose of generating the tuning voltage, the charging voltage at the capacitor is connected with high impedance via a field-effect transistor to the varactors. The capacitor is connected, via a contact of a relay controlled by a first bistable multivibrator, either to a source of reference potential or to a charging voltage source depending on the direction of the search run. When a signal station is received, a pulse is directed to the first multivibrator. The pulse is filtered from the i-f signal after frequency conversion to a lower frequency and is obtained via a rectifier and a Schmitt trigger. The relay is switched off via a switching stage controlled by the first bistable multivibrator and disconnects the charging capacitor from the source to thereby stop the search operation.

BRIEF DESCRIPTION OF THE DRAWINGS

The foregoing, together with other objects, features and advantages of the invention will be more fully understood from the following detailed description, taken in conjunction with the accompanying drawings in which.

DETAILED DESCRIPTION OF THE INVENTION

Figure 1:
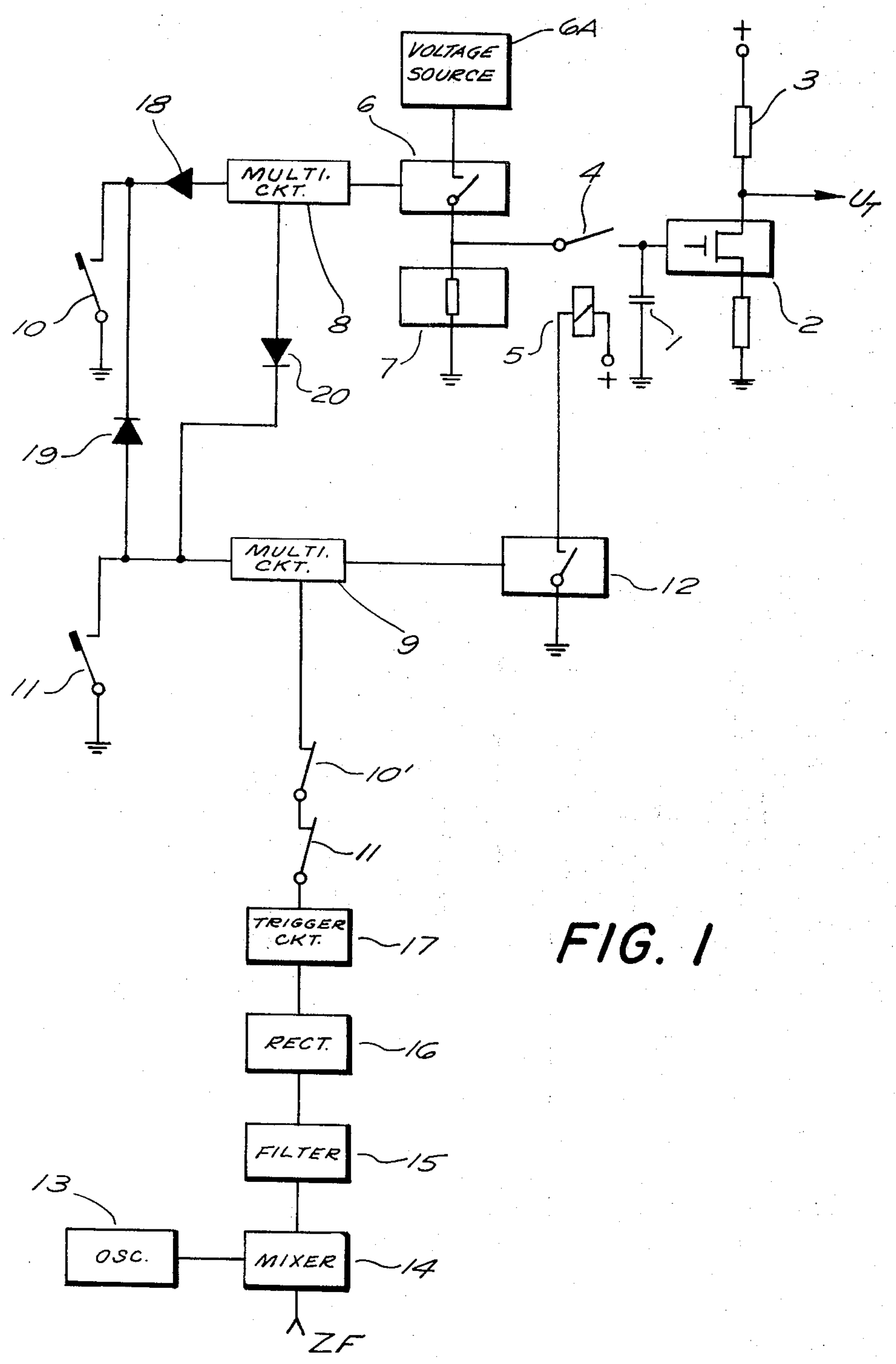
FIG. 1 is a block diagram of a circuit arrangement for an automatic station search according to the invention.

A modified block diagram of a circuit arrangement according to the invention is shown in FIG. 1 and includes a capacitor 1, the charging voltage of which is used to generate the desired tuning voltage $U_t$. The capacitor 1 is connected to a high impedance control electrode of a field effect transistor (FET) 2. The output tuning voltage $U_t$ can be obtained at the load resistor 3 of the FET 2. To change the tuning voltage, the capacitor 1 is connected, via a contact 4 of a relay 5 either to a voltage source 6A via a switching stage 6 or to a source of reference potential such as the chassis ground. To initiate and stop the search cycle a pair of bistable multivibrator 8 and 9 are employed, as will be described herein below.

Depending on the desired direction of the search run which is selectable by means of contacts 10 and 11, the bistable multivibrator 8 actuates the switching stage 6 to either charge or discharge the capacitor 1. The bistable multivibrator 9 upon initiation of any search operation, energizes the relay 5 via a switching stage 12, until a stop pulse is generated when a station signal is received. The stop pulse is derived from the received i-f signal ZF. Generating the stop pulse from the received signal assures that the search-run automatic system is stopped exactly at a station. The stop pulse is generated through the frequency conversion of the received i-f signal by means of an oscillator 13 and a mixing stage 14 and filtered via a narrow-band filter 15. After rectification via a rectifier 16, a very steep pulse is generated by means of a Schmitt trigger 17, and is directed to the bistable multivibrator 9 for resetting the bistable. This resetting causes the relay 5 to be switched off via the switching stage 12, whereby the relay contact 4 is opened, the voltage at the capacitor 1 is disconnected, and a high impedance exists across the capacitor.

By the aforementioned generation of a very narrow stop pulse even weak stations next to strong stations can be captured unabiguously and the automatic fine frequency tuning need not have a large resetting ratio.

By pushing the buttons 10 and 11 respectively, the tuning voltage is lowered and raised. When the button 10 is pressed both bistable multivibrators 8 and 9 are set, via the action of diodes 18 and 19, to the state required for a decreasing tuning voltage. When the button 11 is pressed the multivibrator 8 is set in the state, via the action of diode 20, into the state in which the voltage source 6A is disconnected by the action of the switching stage 6. The capacitor 1 is discharged via the resistor 7 whereby the tuning voltage $U_t$ at the drain terminal of the FET transistor 2 rises.

If a controlled search run is desired, i.e., if the automatic search system is not to stop at every station, there can be provided in the line for the stop pulse contacts 10′ and 11′ associated with the pushbuttons 10 and 11, which upon operation of the search run buttons 10 and 11 suppress the stop pulse as long as desired, for instance, through increasing the excursion. For simplicity, the contacts for initiating the search and controlled runs 10, 10′, 11, 11′ are shown as mechanical contacts. However, the switching operations mentioned can also be initiated electronically.

Figure 2:
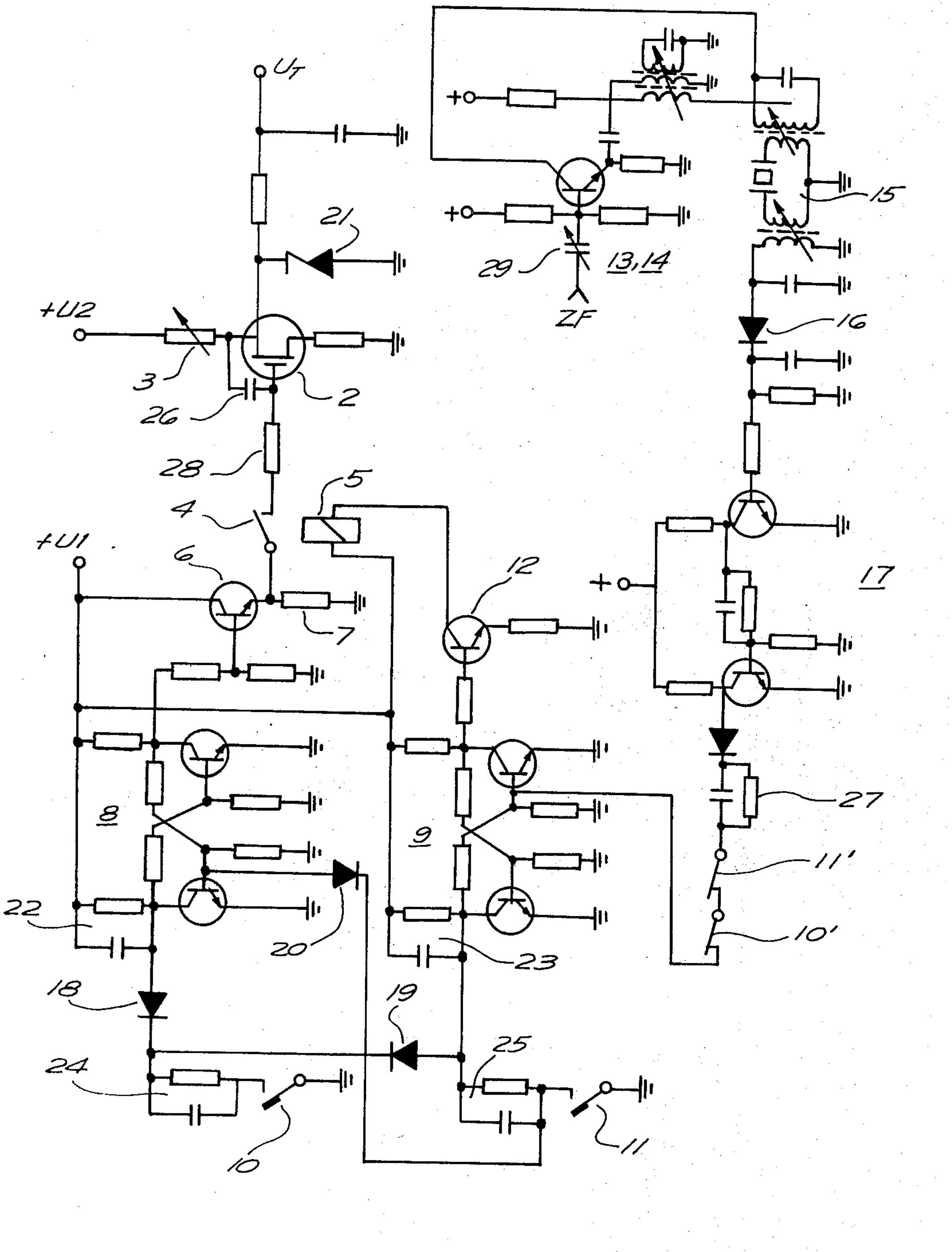
FIG. 2 is a detailed schematic diagram of a circuit according to FIG. 1.

FIG. 2 is a schematic representation of the block diagram according to FIG. 1. When the supply voltage is switched on, R-C circuits 22 and 23 at the outputs of the multivibrators 8 and 9 cause the latter to flip initially into the L-O (conducting-open) state. It is assumed for purposes of explanation that the tuning voltage $U_t$ is set to a value which corresponds to the middle of the frequency range to be received. If the tuning voltage is to be lowered to receive a lower frequency, the search-run button 10 is pressed, so that, via the R-C member 24 and the diodes 18 and 19, the two bistable multivibrators 8 and 9 are flipped to the state O-L. This has the effect that the driving voltage is directed via the switching stage 6, to the relay contact 4, which is closed by the relay 5 via the bistable stage 9 and the following switching stage 12. The driving voltage appears at the control electrode of the field-effect transistor 2, which in conjunction with the capacitor 26 is connected here by way of example as a Miller integrator. A slowly rising positive voltage builds up at the gate of the FET 2, so that the voltage at the load resistor 3 and therefore, the tuning voltage $U_t$, decreases slowly. If now the automatic search system gets into the range of a station worth receiving, (in which connection the value of the response threshold can be set by the trimmer capacitor 29), the system is switched off by a stop pulse transmitted to the bistable multivibrator 9 resetting it to the state L-O, so that the switching stage 12 disconnects the relay from the supply voltage and the contact 4 prevents a further rise at the control electrode of the FET 2. One advantage of the circuit is that the capacitor is effectively disconnected from the siwtching stage via the relay contact 4 at high impedance due to the use of the field-effect transistor. The capacitor and high impedance provide a substantial storage effect. The generation of the stop pulse is accomplished as follows:

When a station signal of a sufficient magnitude is received, an i-f voltage is directed to a self-oscillating mixing stage 13,14. This self-oscillating mixing stage converts the frequency of the i-f voltage, for instance, from 10.7 MHz to a lower frequency, for instance, 460 kHz, which can be filtered out via a narrow-band ceramic filter 15. A positive pulse is generated via the rectifier 16 which switches on the Schmitt trigger 17 so that a positive step voltage can reach the input of the multivibrator 9 via the R-C circuit 27.

If the automatic search run system is to proceed to higher frequencies, the button 11 is closed, so that the bistable multivibrator 9 is set to the state O-L and the bistable multivibrator 8 is set to the state L-O via the diode 20. When the bistable multivibrator 9 again energizes the relay 5 via the switching stage 12, the contact 4 couples the resistor 7 to the control electrode of the FET 2 and therefore to the capacitor 26. The driving voltage is switched off by the switching stage 6 due to the state of the multivibrator 8, so that the capacitor 26 can slowly discharge via the relay contact 4 and the low-resistance resistance resistor 7. The falling voltage at the control input of the field-effect transistor 2 causes a gradual voltage rise at the load resistor 3 and therefore, of the tuning voltage $U_t$. If a station of predetermined signal magnitude is reached, a stop pulse obtained from the i-f signal again causes the bistable multivibrator 9 to change state and thereby to switch off the relay 5. Due to the high-impedance design, the tuning voltage is kept constant also here over an extended period of time.

While the upper value of the tuning voltage $U_t$ is determined by the Zener diode 21, the lower value can be set by means of the resistor 3, which is implemented by a variable resistor.

The speed with which the search run proceeds, depends on the driving voltage $U_1$ and on the choice of the resistor 28.

In conclusion, the measures will further be described which assure the greatest possible linearization of the dependence of the tuning frequency on the tuning voltage. The linearization of the characteristic $f=f(U_t)$ is achieved by charging the Miller capacitor 26 in conjunction with a field-effect transistor by means of a positive d-c voltage. The magnitude positive d-c voltage $U_2$ is chosen such that the field-effect transistor is driven into saturation. With the capacitor 26 uncharged, the highest required tuning voltage $U_t$ is kept constant via a Zener diode 21. By operating, for instance, the pushbutton 10 for tuning in the direction toward lower receiving frequencies, a high positive voltage $U_1$ appears at the emitter resistor of the switching stage 6. This voltage $U_1$ initially charges the capacitor 26 linearly, and with this positive charging, the control electrode of the field-effect transistor 2 causes a larger drain current, whereby the drain potential drifts downward. This linear drop is further aided by the initially linear rise of the $I_{DS}/U_{GS}$ characteristic of the field-effect transistor 2. This linear drop of the tubing voltage $U_t$ is desirable, as at higher tuning voltages the capacitance variation is considerably smaller than at lower tuning voltages. As the capacitor 26 continues to charge up positively, the tuning voltage drops further. The field-effect transistor 2 is driven further into the saturation region of its $I_{DS}/U_{GS}$ characteristic, while simultaneously the charging of the capacitor slows down according to the charging curve. Thereby a smaller change of the tuning voltage is obtained at low frequencies. In this manner a tuning voltage $U_t$ which is linear with frequency is obtained.

If the tuning voltage $U_t$ is at a potential which corresponds to the lowest receiving frequency, the capacitor 26 is fully charged, and upon operation of the pushbutton 11 which initiates the search run toward higher frequencies, this capacitor is discharged via the emitter resistor 7 in such a manner that the voltage drops rapidly. This situation is undesirable at low frequencies because of the large capacitance variation. However, the field-effect transistor 2 is in saturation and the rapid initial voltage drop at the capacitor 26 is compensated again so that the tuning voltage $U_t$ rises linearly with frequency.

The rapid rise of the tuning voltage $U_t$ is therefore retarded considerably by the characteristic $I_{DS}/U_{GS}$ of the FET 2. At the end of the capacitor discharge with its flat wave shape, the linear portion of the field-effect transistor characteristic is again reached, and compensation for a tuning voltage $U_t$ linear with frequency is achieved again. The driving voltage $U_1$ for the capacitor is chosen large enough that with an appropriate choice of the resistor 3 the field-effect transistor is driven into saturation.

From the foregoing it is evident that a simple and effective circuit arrangement for a television automatic station search and locking system has been provided. The invention is not to be limited by what has been particularly shown and described except to the extent indicated in the appended claim.

What is claimed is:

1. In an automatic station search system including a tuning element responsive to a variable voltage; a circuit arrangement for generating a variable voltage comprising:

an output terminal;

voltage storage means operative to store voltage levels;

a high impedance circuit element coupled between the output terminal of said circuit arrangement and said voltage storage means and being operative in response to said voltage levels stored in said voltage storage means to generate associated voltage levels at the output terminal of said circuit arrangement;

first switching circuit having an output connection coupled to the common juncture of said voltage storage means and said high impedance circuit element, an input connection, and a control connection, said first switching circuit being responsive to a first signal condition at its control terminal to connect its input connection to its output connection;

first multivibrator circuit having an output connection coupled to the control connection of said first switching circuit, first and second input connections and being operative in response to a second signal condition at its first input connection to establish said first signal condition at the control connection of said first switching circuit and being operative in response to a third signal condition at its second input connection to remove said first signal condition from the control connection of said first switching circuit;

second switching circuit including a voltage source and having an output connection coupled to the input connection of said first switching circuit and an input connection, said second switching circuit being operative in response to fourth and fifth signal conditions at its input connection to furnish charge and discharge paths respectively for said voltage storage means when said first signal condition is present at the control connection of said first switching circuit;

second multivibrator circuit having an output connection coupled to the input connection of said second switching circuit, and having first and second input connections said second multivibrator circuit being operative in response to a sixth signal condition at its first input connection to generate the fourth signal condition at the input connection of the second switching circuit and being operative to a seventh signal condition to generate the fifth signal condition at the input connection of said second switching circuit;

third switching circuit having an output connection coupled to the first input connection of said second multivibrator circuit and to the first input connection of said first multivibrator and being operative to establish said sixth and second signal conditions respectively at first input connections of said second and first multivibrator circuit whereby a charge path for voltage storage means is established;

fourth switching circuit having an output connection coupled to the first input connection of said first multivibrator circuit and to the second input connection of said second multivibrator circuit and being operative to establish the second and seventh signal conditions respectively at first and second input connections of said first and second multivibrator circuits whereby a discharge path is provided for said voltage storage means.

2. A circuit arrangement according to claim 1 further including an amplitude threshold means having an output connection coupled to the second input connection of said first multivibrator circuit and an input connection and being operative in response to a predetermined signal at its input connection to establish the third signal condition at the second input connection of said first multivibrator circuit whereby both the charge and discharge paths for said voltage storage means are interrupted.

3. A circuit arrangement according to claim 2 wherein said threshold means includes:

means for down converting the predetermined signal;

narrow band filter coupled to said means for down converting and being operative to filter the down converted signal;

rectifier circuit coupled to said filter means and being operative to rectify the down converted filtered signal;

Schmitt trigger circuit having an input connection coupled to said rectifier circuit and an output connection coupled to the second input connect of said first multivibrator circuit and being operative in response to the rectified signal to establish the third signal condition at the second input connection of said first multivibrator circuit.

4. A circuit arrangement according to claim 2 further including a switch between the output connection of said threshold means and the second input connection of said first multivibrator circuit and being operative to interrupt an output signal from said threshold means.

5. A circuit arrangement according to claim 1 wherein said second switching circuit includes:

a voltage source;

a source of reference potential;

a transistor having a first element coupled to the output connection of said second multivibrator circuit, a second element coupled to said voltage source and a third element coupled to the input connection of said first switching circuit;

a resistor coupled between said source of reference potential and the common juncture of said third element and the input connection of said first switching circuit;

said transistor being operative in response to fifth and fourth signal conditions to respectively couple the input connection of said first switching means to said source of reference potential through said resistor and to said voltage source.

* * * * *